United States Patent [19]

Renguso et al.

[11] Patent Number: 5,266,380
[45] Date of Patent: Nov. 30, 1993

[54] METHOD AND APPARATUS FOR VISUAL VERIFICATION OF PROPER ASSEMBLY AND ALIGNMENT OF LAYERS IN A MULTI-LAYER PRINTED CIRCUIT BOARD

[75] Inventors: Anthony J. Renguso, N. Lauderdale; Long V. Pham, Boynton Beach; Tuan K. Nguyen, Boca Raton; Basil P. Pappademetriou, Palm Bay, all of Fla.

[73] Assignee: Motorola, Inc., Schaumburg, Ill.

[21] Appl. No.: 942,004

[22] Filed: Sep. 8, 1992

[51] Int. Cl.⁵ .............................................. B32B 9/00
[52] U.S. Cl. ................................. 428/192; 428/209; 428/901; 174/250
[58] Field of Search ........................ 428/209, 192, 901; 174/250

[56] References Cited

U.S. PATENT DOCUMENTS 4,243,474  1/1981  Shirai et al. .................... 156/630
4,810,563  3/1989  DeGree et al. .................... 428/209

*Primary Examiner*—Patrick J. Ryan
*Assistant Examiner*—Cathy Lee
*Attorney, Agent, or Firm*—Thomas G. Berry; Daniel R. Collopy

[57] ABSTRACT

A printed circuit (pc) board (105) having at least two layers, wherein proper assembly and alignment of the at least two layers may be visually verified, comprises a first layer (410) having a first printed circuit pattern (305) formed thereon, the first printed circuit pattern (305) including a first identifier (115) formed along at least one edge (405) of the first layer (410). The pc board (105) further comprises a second layer (420) having a second printed circuit pattern (305) formed thereon, the second printed circuit pattern (305) including a second identifier (120) formed along at least one edge (405) of the second layer (420), the second identifier (120) being visibly aligned with the first identifier (115) in a predetermined alignment to indicate that the first layer (410) and the second layer (420) are correctly laminated.

6 Claims, 2 Drawing Sheets

METHOD AND APPARATUS FOR VISUAL VERIFICATION OF PROPER ASSEMBLY AND ALIGNMENT OF LAYERS IN A MULTI-LAYER PRINTED CIRCUIT BOARD

FIELD OF THE INVENTION

This invention relates in general to the assembly of multi-layer printed circuit boards and more specifically to a method by which a multi-layer printed circuit board may be visually inspected to verify proper assembly and alignment of the layers.

BACKGROUND OF THE INVENTION

Conventionally, electronic devices include one or more printed circuit (pc) boards for electrically connecting components, e.g., resistors, capacitors, etc. As electronic devices have become more complex, the component interconnections on printed circuit boards have necessarily also become more complex. As a result, to prevent the overcrowding of components and interconnections on the pc boards, many complex electronic devices commonly include pc boards having more than one layer on which the interconnections between the components may be constructed.

During the manufacture of a multi-layer pc board, a substrate coated with a conductive metal, i.e., a pc board layer, is covered with a film to mark the areas which are to remain metallized, i.e., the interconnections. The layer is then lowered into an acid bath to remove the conductive metal from the areas of the layers left uncovered by the film. After the selective removal of the metallization from the layer, the layer is aligned and stacked, along with other layers of the multi-layer pc board, subsequent to which the layers are pressed together by lamination equipment to form the multi-layer pc board. During the pressing process, however, the layers sometimes float out of alignment, resulting in incomplete component interconnections. This misalignment often remains undetected until after the components are reflowably soldered onto the multi-layer pc board, in which case the completed pc board may operate incorrectly, if at all. As a result, the pc board must be analyzed to determine the source of the incorrect operation, thus wasting time and material.

A further source of error during the pc board manufacturing stage resides in the stacking of the layers, which is typically performed manually. During this process, the possibility exists that the layers could be stacked incorrectly. The incorrect stacking of outer layers, which are usually etched with a known circuit pattern, is easily detected. The incorrect stacking of inner layers, however, is very difficult to detect. Therefore, as in the case of misalignment, the error may not be discovered until after the pc board is completed, thereby resulting in wasted time and material, both of which may be reflected in an increased product cost.

Thus, what is needed is a multi-layer pc board which may be visually inspected, prior to component placement, to verify proper assembly and alignment of the layers. Furthermore, a method for constructing such a multi-layer pc board is also needed.

SUMMARY OF THE INVENTION

According to an aspect of the present invention, a printed circuit (pc) board has at least two layers, wherein proper assembly and alignment of the at least two layers may be visually verified. The pc board comprises a first layer having a first printed circuit pattern formed thereon, wherein the first printed circuit pattern includes a first identifier formed along at least one edge of the first layer. The pc board further comprises a second layer having a second printed circuit pattern formed thereon, wherein the second printed circuit pattern includes a second identifier formed along at least one edge of the second layer. The second identifier is visibly aligned with the first identifier in a predetermined alignment to indicate that the first layer and the second layer are correctly laminated.

DESCRIPTION OF A PREFERRED EMBODIMENT

Figure 1:
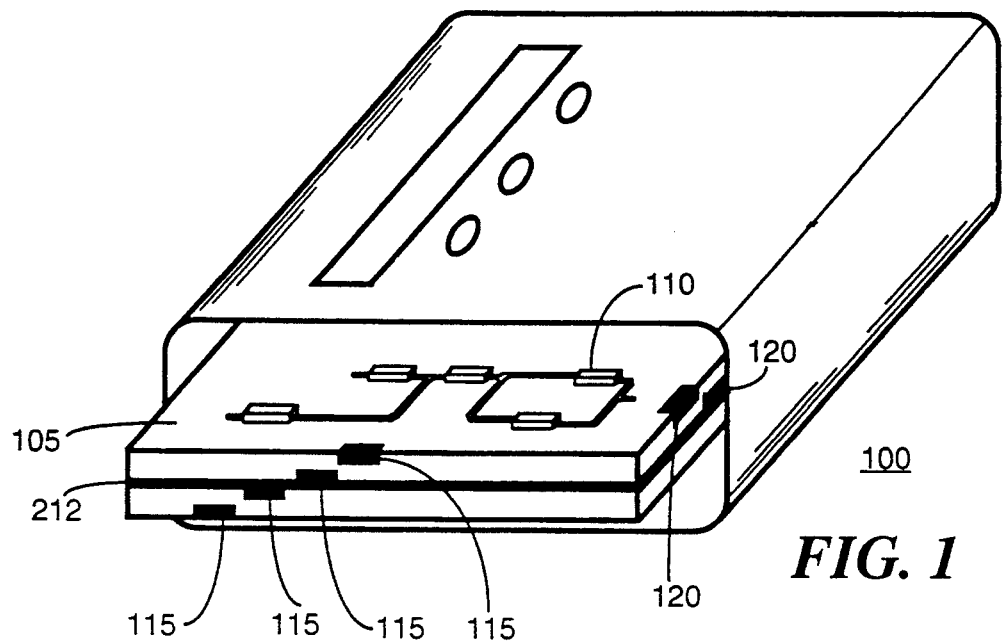
FIG. 1 is an illustration of an electronic device having a multi-layer printed circuit (pc) board in accordance with a preferred embodiment of the present invention.

FIG. 1 is an illustration of an electronic device 100 having a multi-layer printed circuit (pc) board 105 on which electrical components 110, such as resistors and capacitors, may be mounted. Additionally, in accordance with a preferred embodiment of the present invention, each layer of the pc board 105 is marked with alignment identifiers 115, 120, as shown, which may be visually inspected to verify that the layers have been properly aligned in a predetermined alignment and assembled to correctly form the pc board 105.

Figure 2:
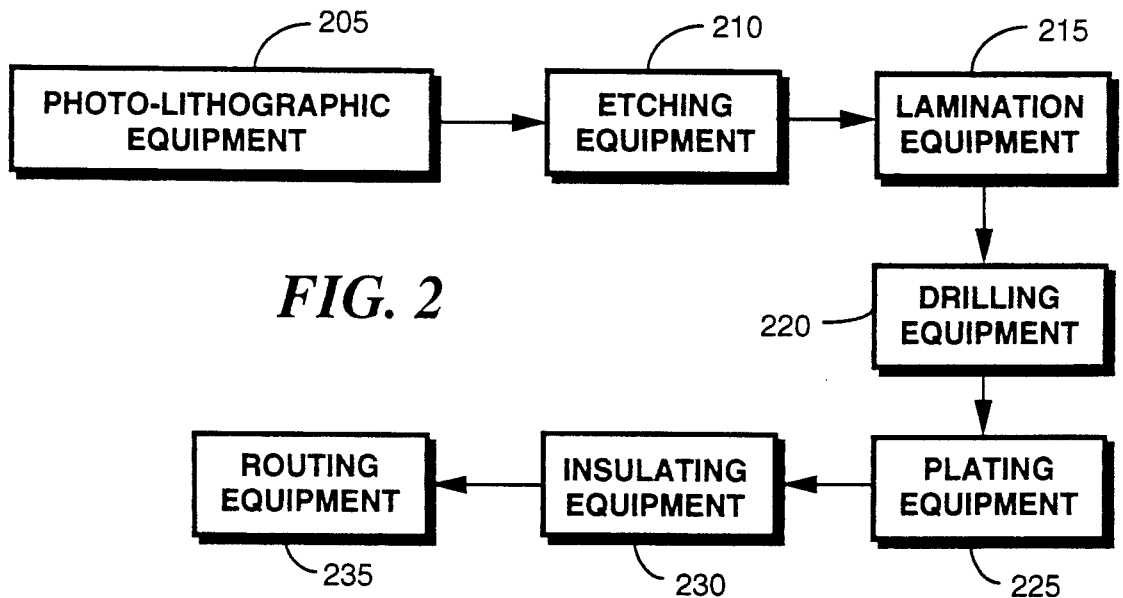
FIG. 2 is an illustration depicting a process, in accordance with the preferred embodiment of the present invention, by which the multi-layer pc board of FIG. 1 may be constructed.

Referring next to FIG. 2, an illustration depicts a process by which the multi-layer pc board 105, in accordance with the preferred embodiment of the present invention, may be constructed. The initial step in the manufacture of the pc board 105, which has four coplanar conducting layers, is the processing, by photo-lithographic equipment 205, of a substrate coated on both sides with a conductive metal. The photo-lithographic equipment 205 prints a film onto the first side of the substrate, which corresponds to the first pc board layer, and onto the second side of the substrate, which corresponds to the second pc board layer, in the areas in which metallization is to remain. Typically, for construction of a conventional pc board layer, the metallization covered by the film defines only a desired printed circuit pattern. In accordance with the preferred embodiment of the present invention, however, metallized areas which are to later serve as the alignment identifiers 115, 120 (FIG. 1) are additionally covered by the film on each side of the substrate. Preferably, the film covers a first metallized area of the first side, later to serve as an x-axis alignment identifier 115 for the first layer, located along and slightly overlapping a first predetermined edge of the pc board 105 (FIG. 1). The film further covers a second metallized area of the first side, later to serve as a y-axis alignment identifier 120 for the first layer, located along and slightly overlapping a second predetermined edge, preferably adjoining the first predetermined edge, of the pc board 105. In like manner, a first metallized area of the second side, later to serve as an x-axis alignment identifier 115 for the second layer, and a second metallized area of the second side, later to serve as a y-axis alignment 120 identifier for the second layer, are also covered by a film during the photo-lithographic process. Thereafter, etching equipment 210, typically an acid bath, removes the metallization from the areas of the substrate which are not covered by the film.

Figure 3:
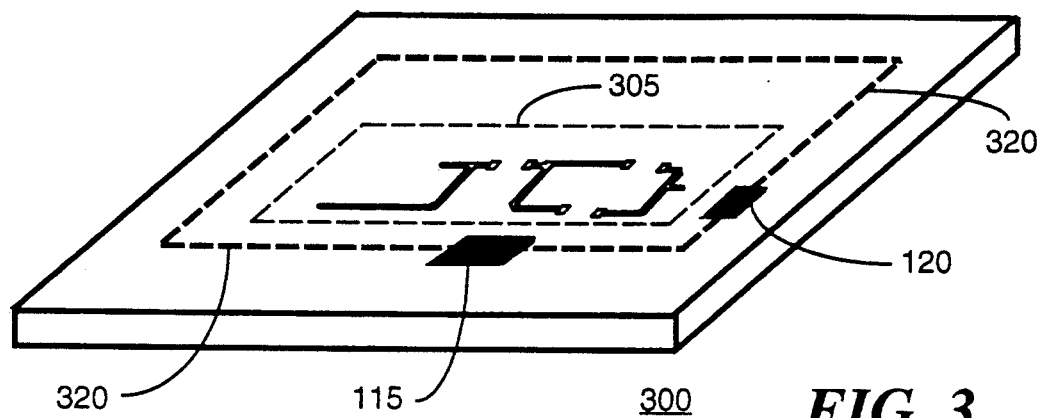
FIG. 3 is an illustration of a pc board substrate having alignment identifiers formed thereon, in accordance with the preferred embodiment of the present invention.

The etching process yields a selectively metallized substrate 300, as depicted in FIG. 3, which includes two layers of the multi-layer pc board 105. Although only the first layer is shown, the substrate 300 includes metallization which defines a printed circuit pattern 305, an x-axis alignment identifier 115, and a y-axis alignment identifier 120 for each of the two layers. As described above, the alignment identifiers 115, 120 for each layer preferably overlap adjoining areas of the substrate which will become predetermined edges 320 of the pc board 105 (FIG. 1).

Figure 4:
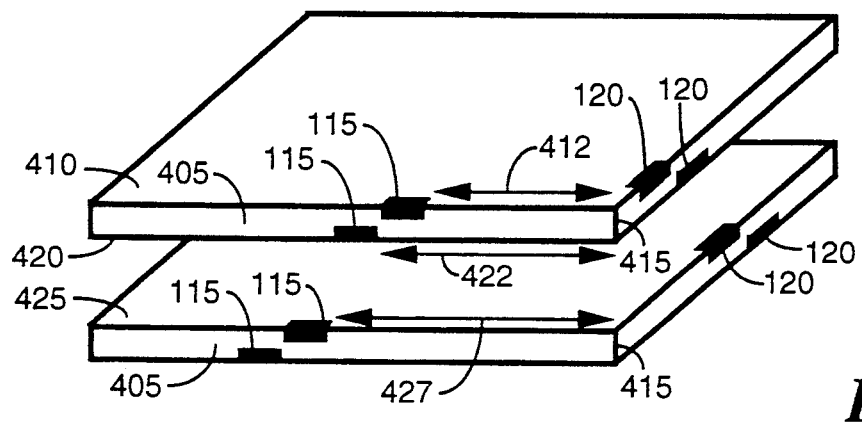
FIG. 4 is a cutaway view of pc board layers, each of which has alignment identifiers formed thereon, in accordance with the preferred embodiment of the present invention.

During construction of a multi-layer pc board, one substrate may be processed in the above described manner to yield two layers of a multi-layer pc board. In the case of the multi-layer pc board 105 (FIG. 1), which has four layers, two substrates would be processed to provide the four layers, i.e., each side of a substrate would serve as a single layer. However, the positioning of the alignment identifiers 115, 120 is slightly different for each layer, as may be better understood by reference to FIG. 4. FIG. 4 depicts a view of the layers cut away from the substrates. As shown, each x-axis alignment identifier 115 is formed along the same predetermined edge 405 of the pc board 105 (FIG. 1). However, each x-axis alignment identifier 115 is positioned a different distance along the predetermined edge 405. For example, the x-axis alignment identifier 115 on a top layer 410 may be formed at a first distance (d) 412 from a predetermined corner 415 of the pc board 105. The x-axis identifier 115 on a second layer 420 may be formed at a second distance (d+x) 422 from the corner 415. It follows that the x-axis identifier 115 on a third layer 425 may then be formed at a third distance (d+(2x)) 427. Therefore, each resulting x-axis identifier 115 is positioned relative to the other x-axis identifiers 115, in accordance with the preferred embodiment of the present invention, in a predetermined alignment. In like manner, each of the y-axis identifiers 120 are also positioned relative to the other y-axis identifiers 120 in a predetermined alignment.

Returning to FIG. 2, after the etching process, the substrates, consisting of the layers and surrounding excess pc board material, are laminated together with an insulator 212 (FIG. 1), such as another etched substrate or other type of insulating layer, which provides electrical insulation between the inner layers. During the lamination process, the substrates and the insulator are stacked and aligned, subsequent to which lamination equipment 215 compresses the substrates and the insulator to form the multi-layer pc board 105 (FIG. 1), which remains surrounded by excess pc board material. Thereafter, drilling equipment 220 is employed to drill via holes in metallized areas in which the layers are to be electrically coupled. The electrical interconnection of these areas is preferably performed by plating equipment 225, which coats the via holes with a conductive material. During this process, metallized component pads and electrical test pads, located on only the outer layers of the pc board 105, are also plated. The outer layers, excepting the component pads and the electrical test pads, are then coated with a non-conductive insulator, preferably by insulating equipment 230. The construction of the pc board 105 (FIG. 1) is finally completed in a routing process, during which routing equipment 235 cuts the excess pc board material from around the pc board 105. As a result of this process, the alignment identifiers 115, 120 (FIG. 4), which, in accordance with the preferred embodiment of the present invention, slightly overlap two edges of the resulting pc board 105, are visible in side views of the two edges.

Figure 5:
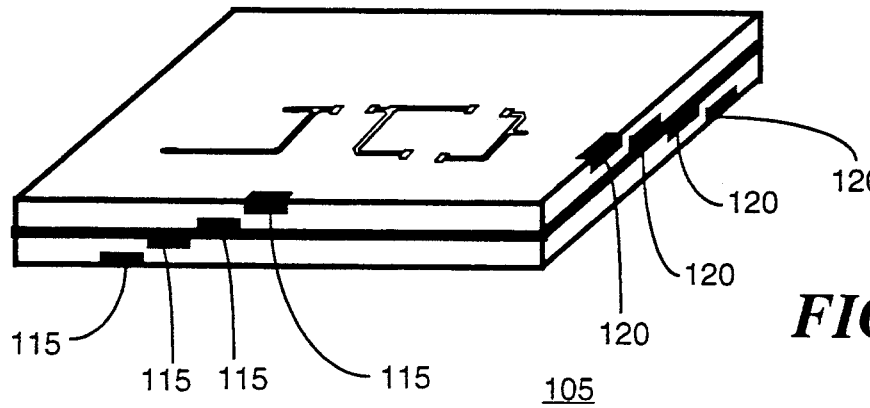
FIG. 5 is an illustration depicting proper assembly and alignment of the pc board layers of FIG. 4 in accordance with the preferred embodiment of the present invention.

Referring next to FIG. 5, an illustration depicts the pc board 105, subsequent to proper alignment and assembly of the layers. In accordance with the present invention, visual inspection of the alignment identifiers 115, 120 allows an operator to verify that the pc board 105 has been properly constructed. As shown, the x-axis alignment identifier 115 for each pc board layer is preferably positioned relative to the x-axis identifiers 115 for the surrounding pc board layers. Additionally, the y-axis alignment identifier 120 for each pc board layer is positioned relative to the y-axis identifiers 120 for the surrounding pc board layers. It can be determined by visual inspection that no assembly and/or alignment errors, which would be indicated by misaligned alignment identifiers 115, 120, are present in the pc board 105 because the alignment identifiers 115, 120 appear from visual inspection to be positioned in the predetermined alignment.

In accordance with the preferred embodiment of the present invention, therefore, an error in the alignment or assembly of the pc board 105 can be visually detected before placement of the electrical components 110 (FIG. 1) on the pc board 105. In conventional pc boards, such errors are often not detected until a pc board operates incorrectly, usually after population of the pc board with electrical components. As a result, in conventional pc boards, misalignment or assembly errors often cause wasted time during which the incorrectly operating pc board is analyzed to determine the source of the error. Furthermore, because the error is usually not detected until after placement of the electrical components, some of which may be very expensive, material, as well as time, is wasted.

Figure 6:
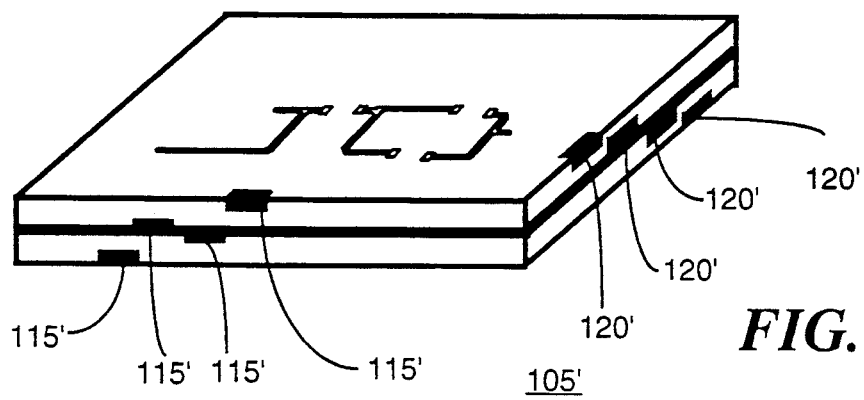
FIG. 6 is an illustration depicting improper alignment of pc board layers included in a multi-layer pc board in accordance with the preferred embodiment of the present invention.

Referring next to FIG. 6, an illustration depicts an example of an improperly constructed multi-layer pc board 105', wherein misalignment of the layers may be visually detected as soon as the pc board 105' has been routed from the excess pc board material. In accordance with the preferred embodiment of the present invention, the x-axis alignment identifiers 115' and the y-axis alignment indicators 120' are misaligned. Therefore, the relative positions of the alignment identifiers 115', 120' indicate that the pc board layers have been assembled incorrectly, in which case the interconnections between the pc board layers may not be complete. Furthermore, this determination may advantageously be made as soon as the pc board 105' is separated from the excess pc board material, thereby preventing placement of electrical components on the pc board 105'.

In summary, a multi-layer pc board having alignment identifiers, in accordance with the preferred embodiment of the present invention, may be visually inspected to verify proper alignment and assembly of the pc board layers. Furthermore, this verification may occur as soon as formation of the pc board is complete, i.e., when the pc board is separated from excess pc board material. Conventional multi-layer pc boards, on the other hand, have no distinguishing characteristics by which proper assembly and alignment of the pc board layers may be verified. Therefore, often the first indication of a pc board construction error is improper electrical operation of the pc board, in which case the pc board has necessarily been populated with electrical components. Improper electrical operation, however, may also be indicative of many other problems, such as placement of an incorrect or inoperable component. As a result, time may be wasted during which the pc board must be analyzed to determine the source of the incorrect operation. Because an improperly assembled or misaligned pc board cannot be salvaged, both the pc board and the electrical components must then be discarded. The end result of the wasted time and material is often an increase in manufacturing cost, which is usually reflected in an increased product cost.

In accordance with the preferred embodiment of the present invention, however, pc board errors may be detected before placement of electrical components on a pc board. Therefore, improperly constructed pc boards, without electrical components, are discarded, thus saving the cost of discarded electrical components. Furthermore, time, which might have been required to place components and analyze a conventional pc board, is saved, thereby possibly decreasing manufacturing costs for pc boards constructed according to the present invention. Finally, because the verification of proper assembly and alignment is a simple, one-step visual inspection process, no test equipment is necessary to analyze the pc board for construction errors.

It may be appreciated by now that there has been provided a multi-layer pc board which may be visually inspected, prior to component placement, to verify proper assembly and alignment of the layers. There has also been provided a method for constructing such a multi-layer pc board.

We claim:

1. A printed circuit (pc) board having at least two layers, wherein proper assembly and alignment of the at least two layers may be visually verified, the pc board comprising:
   a first layer having a first printed circuit pattern formed thereon, the first printed circuit pattern including a first identifier formed along at least one edge of the first layer; and
   a second layer having a second printed circuit pattern formed thereon, the second printed circuit pattern including a second identifier formed along at least one edge of the second layer, the second identifier being visibly aligned in a predetermined alignment with the first identifier to indicate that the first layer and the second layer are correctly laminated.

2. A printed circuit (pc) board having at least two layers, wherein proper assembly and alignment of the at least two layers may be visually verified, the pc board comprising:
   a first layer having a first printed circuit pattern formed thereon, the first printed circuit pattern including a first identifier formed along a first edge of the first layer; and
   a second layer having a second printed circuit pattern formed thereon, the second printed circuit pattern including a second identifier formed along a first edge of the second layer, the second identifier being visibly aligned in a first predetermined alignment in a first axis with the first identifier to indicate that the first layer and the second layer are correctly laminated.

3. The pc board in accordance with claim 2, wherein:
   the first printed circuit pattern further includes a third identifier formed along a second edge of the first layer;
   the second printed circuit pattern further includes a fourth identifier formed along a second edge of the second layer; and
   the third identifier is visibly aligned in a second predetermined alignment in a second axis with the fourth identifier to indicate that the first layer and the second layer are correctly laminated.

4. A printed circuit (pc) board having at least two layers, wherein proper assembly and alignment of the at least two layers may be visually verified, the pc board comprising:
   a first layer having a first printed circuit pattern formed thereon, the first printed circuit pattern including a first identifier formed along at least one edge of the first layer; and
   a second layer having a second printed circuit pattern formed thereon, the second printed circuit pattern including a second identifier formed along at least one edge of the second layer; and
   a third layer having a third printed circuit pattern formed thereon, the third printed circuit pattern including a third identifier formed along at least one edge of the third layer, wherein the first identifier, the second identifier, and the third identifier are visibly aligned in a predetermined alignment to indicate that the first layer, the second layer, and the third layer are correctly laminated.

5. The pc board in accordance with claim 4, wherein:
   the second identifier is visibly positioned relative to the first identifier when the second layer is correctly assembled to the first layer; and
   the third identifier is visibly positioned relative to the second identifier when the third layer is correctly assembled to the second layer.

6. An electronic device, comprising:
   a printed circuit (pc) board having at least two layers, wherein proper assembly and alignment of the at least two layers may be visually verified, the pc board comprising:
   a first layer having a first printed circuit pattern formed thereon, the first printed circuit pattern including a first identifier formed along at least one edge of the first layer; and
   a second layer having a second printed circuit pattern formed thereon, the second printed circuit pattern including a second identifier formed along at least one edge of the second layer, the second identifier being visibly aligned in a predetermined alignment with the first identifier to indicate that the first layer and the second layer are correctly laminated;
   components for supporting the electrical operation of the electronic device, wherein the components are mounted on the pc board and are electrically coupled by the first printed circuit pattern and the second printed circuit pattern;
   a battery for powering the electronic device; and
   a housing for enclosing the pc board, the components, and the battery.

* * * * *